(12) United States Patent
Abuelma'Atti et al.

(10) Patent No.: US 8,706,434 B1
(45) Date of Patent: Apr. 22, 2014

(54) NONLINEAR SYSTEMS MEASUREMENT SYSTEM AND METHOD

(71) Applicant: King Fahd University of Petroleum and Minerals, Dhahran (SA)

(72) Inventors: Muhammad Taher Abuelma'Atti, Dhahran (SA); Ali Muhammad Taher Abuelma'Atti, Widnes (GB)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/025,734

(22) Filed: Sep. 12, 2013

(51) Int. Cl.
- *G06F 15/00* (2006.01)
- *G01R 27/04* (2006.01)
- *G01R 23/20* (2006.01)

(52) U.S. Cl.
CPC ..................................... *G01R 23/20* (2013.01)
USPC ............................................. 702/66; 324/612

(58) Field of Classification Search
CPC ........................................................ G01R 23/20
USPC ............................................................ 702/66
See application file for complete search history.

(56) References Cited

U.S. PATENT DOCUMENTS

| 4,667,296 A * | 5/1987 | Crowe .......................... 702/110 |
| 5,909,642 A | 6/1999 | Suzuki |
| 7,671,605 B2 * | 3/2010 | Gunyan et al. ................ 324/638 |
| 7,979,837 B1 | 7/2011 | Rao et al. |
| 2010/0141269 A1 * | 6/2010 | Quan ............................ 324/622 |
| 2013/0054169 A1 | 2/2013 | Neidhardt et al. |

OTHER PUBLICATIONS

Walker et al., "Simple, Broadband Relative Phase Measurement of Intermodulation Products," Department of Electrical and Computer Engineering, North Carolina State University (Jun. 2005).

* cited by examiner

Primary Examiner — Bryan Bui
(74) Attorney, Agent, or Firm — Richard C. Litman

(57) ABSTRACT

The nonlinear systems measurement system includes two signal generators generating different sinusoidal frequencies. A spectrum analyzer measures all signals. A single software program synchronizes the instruments. The fetched measurements are kept in data registers in correct sequence for feeding into two curve fitting routines. The sinusoidal signals are fed to a suitable combiner for the expected frequencies and dynamic range of the UUT. The combined signal is applied to the UUT. Via a software-controlled single-pole, triple-throw RF switch, the amplitude of the UUT output and the two input signals are measured at every power step as amplitude I1 and amplitude I2. The amplitude of the output component from the UUT at $f_1-f_2$ is measured as IMD2 and the output component at $2f_1-f_2$ is measured as IMD3. The measured I1 and IMD2 are fed to the curve-fitting routine 1, yielding $r_1$. The measured I2 and IMD3 are fed to curve-fitting routine 2, yielding $r_2$.

9 Claims, 3 Drawing Sheets

NONLINEAR SYSTEMS MEASUREMENT SYSTEM AND METHOD

BACKGROUND OF THE INVENTION

1. Field of the Invention

The present invention relates to the characterization of nonlinear circuits/systems, and particularly to a nonlinear systems measurement system and method.

2. Description of the Related Art

Electronic circuits built around active devices are inherently nonlinear. While this inherent nonlinearity may be considered as a disadvantage, for example, in amplifiers and filters, in some applications designers are trying to optimize their circuits to provide nonlinearities (for example, in mixers and detectors). Of particular interest here is the characterization of electronic circuits/systems exhibiting nonlinearities with even and odd symmetries. Whenever a signal comprising multi-sinusoids is applied to the input of an electronic circuit with even and odd symmetries, the output usually comprises a wide range of harmonics, including sums and differences of the original input frequencies and their harmonics, that is, intermodulation products.

For example, in designing a mixer or a down-converter, the output frequency of interest would be the difference between two input frequencies, while in designing an up-converter, the output frequency of interest would be the sum of two input frequencies. In all cases, it is useful for the designer to have a quick indication of the likely spectrum of output components, including the harmonics and intermodulation products, from a nonlinear electronic circuit/system exhibiting even and odd symmetries when excited by a multi-sinusoidal input signal. This requires a tractable mathematical model for the instantaneous input-output characteristics of the nonlinear electronic circuit/system under consideration.

While a Taylor series-based model is the most straightforward approach for modeling nonlinear characteristics with even- and odd-symmetry nonlinearities, it is useful only when the nonlinearity under consideration contains relatively low orders of distortion, thus allowing the truncation of the Taylor series after a relatively small number of terms. However, nonlinear electronic circuits/systems with hard even and odd symmetries require large numbers of the Taylor series expansion. The parameters of the Taylor series expansion are usually obtained using curve-fitting techniques, with the relative root-mean-square (RRMS) error used as a criterion for deciding the required accuracy of the Taylor series-based model. Increasing the number of terms of the Taylor-series expansion does not necessarily improve the accuracy of the model. In fact, increasing the number of terms may improve the accuracy of the model at or near the original data points, but in between the original data points the fitted curve may oscillate. Thus, a high order Taylor-series model may yield an acceptable RRMS error, when comparing the fitted curve with the original input data, but it may not yield reliable prediction for the harmonic and intermodulation performance of the electronic circuit/system under consideration.

The basic assumption of the methods used to predict the harmonic and intermodulation performance of nonlinear electronic circuits is that the instantaneous input-output transfer characteristic is available. Unfortunately, for practical reasons, this characteristic is not always available, especially at relatively high frequencies where nonlinear circuits/systems are usually characterized by their input-power-output-power characteristic. Obviously, the input-power-output-power characteristic cannot be used for predicting the harmonic and intermodulation performance of nonlinear circuits/systems excited by multisinusoidal input signals. Thus, recourse to the inverse process, that is, predicting the instantaneous characteristic from the measured harmonic or intermodulation performance, would be necessary to obtain the instantaneous characteristic. This would require the use of surface-fitting techniques, especially when a large number of the Taylor series terms are used for modeling the nonlinear characteristics.

From the above discussion it appears that a simple mathematical model that can be easily used for predicting the amplitudes of the harmonics and intermodulation products of a nonlinear electronic circuit/system with even and odd symmetries excited by a multisinusoidal signal is needed.

Thus, a nonlinear systems measurement system and method solving the aforementioned problems is desired.

SUMMARY OF THE INVENTION

The nonlinear systems measurement system includes three off-the-shelf instruments, which include two signal generators to generate pure sinusoidal signals of frequencies $f_1=\omega_1/2\pi$ and $f_2=\omega_2/2\pi$, and one spectrum analyzer to measure all signals. The implementation is software-driven using MATLAB. The three elements of instrument control, measurement data fetching, and curve fitting are all conjoined in one program. The two generated sinusoidal signals are combined in a suitable combiner, depending on frequencies and amplitudes. These amplitudes are dependent on the dynamic range of circuit/system under test. A bi-directional coupler is inserted in the path of each of the input signals to enable measurement of that signal by the spectrum analyzer. The combined signal is applied to the electronic circuit/system under test. A single-pole, triple-throw RF switch is used to enable the amplitude measurement of the output signal from the circuit/system under test, as well as the amplitude of the two input signals to the combiner. This switch is also software-controlled. Thus, the system can measure the variation of the amplitudes of the third-order and second-order intermodulation products as a function of the input tones' amplitudes. Then, the data obtained from measurement is used in a curve-fitting subroutine to obtain the instantaneous characteristics of the device under test. Simple mathematical functions are used to model the nonlinear system under consideration. Later on, this instantaneous characteristic can be used to predict the performance of the device under test under any scenario of the input signal.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
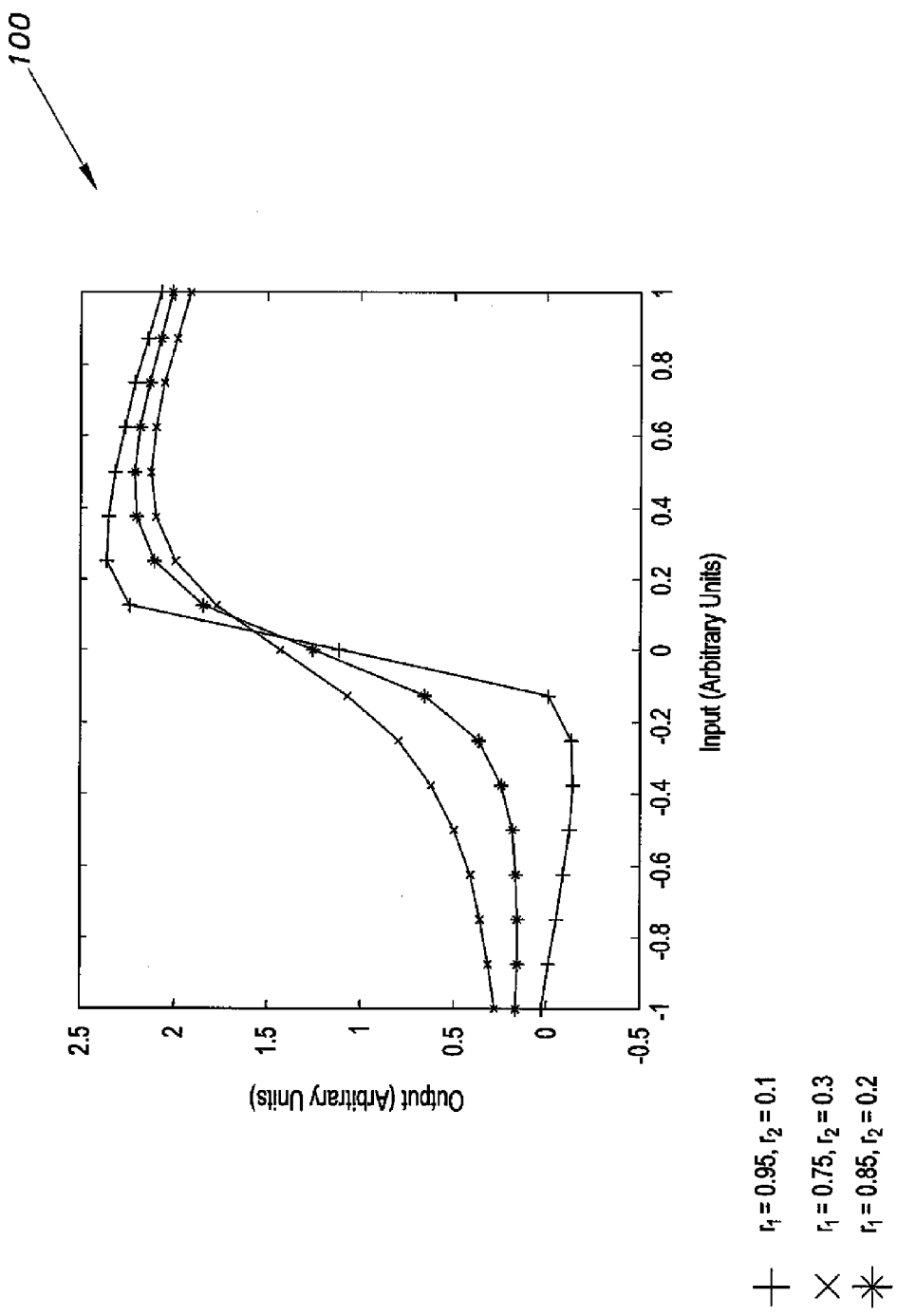
FIG. 1 is a plot showing I/O characteristics of hypothetical nonlinear systems with even and odd symmetries for select r parameters.

At the outset, it should be understood by one of ordinary skill in the art that embodiments of the present method can comprise software or firmware code executing on a computer, a microcontroller, a microprocessor, or a DSP processor; state machines implemented in application specific or programmable logic; or numerous other forms without departing from the spirit and scope of the method described herein. The present method can be provided as a computer program, which includes a non-transitory machine-readable medium having stored thereon instructions that can be used to program a computer (or other electronic devices) to perform a process according to the method. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of media or machine-readable medium suitable for storing electronic instructions.

With respect to the nonlinear systems measurement system, a literature survey shows that there are several even-symmetry and odd-symmetry functions that can be expanded in the infinite cosine- and sine-series of the forms of equations (1) and (2), respectively:

$$y_1(\vartheta) = \frac{1 - r_1\cos\vartheta}{1 - 2r_1\cos\vartheta + r_1^2} = a_0 + \sum_{n=1}^{\infty} a_n \cos n\vartheta, \quad (1)$$

where $r_1^2 < 1$ and $a_n = r_1'$, and $$y_2(\vartheta) = \tan^{-1}\left(\frac{r_2\sin\vartheta}{1 - r_2\cos\vartheta}\right) = \sum_{n=1}^{\infty} b_n \sin n\vartheta \quad (2)$$

where $r_2^2 < 1$ and $b_n = r_2^n/n$.

Thus, a nonlinear circuit/system exhibiting both even- and odd-symmetry nonlinearities can be represented by equation (3):

$$y(\vartheta) = \frac{1 - r_1\cos\vartheta}{1 - 2r_1\cos\vartheta + r_1^2} + \tan^{-1}\left(\frac{r_2\sin\vartheta}{1 - r_2\cos\vartheta}\right). \quad (3)$$

That is, $$y(\vartheta) = a_0 + \sum_{n=1}^{\infty} a_n\cos n\vartheta + \sum_{n=1}^{\infty} b_n\sin n\vartheta. \quad (4)$$

FIG. 1 shows examples of the input-output characteristic of hypothetical nonlinear circuits/systems modeled by equation (4) with different values of $r_1$ and $r_2$. The use of equation (4) in predicting the second-order and third-order intermodulation performance of nonlinear electronic circuits/systems with even and odd symmetries is demonstrated below. Assuming that the nonlinear input-output characteristics of the electronic circuit/system with even and odd symmetry nonlinearities under consideration can be represented by equation (4), with y representing the normalized output and $\vartheta$ representing the normalized input, then, for a multisinusoidal input of the form:

$$\vartheta(t) = \sum_{m=1}^{M} X_m \sin\omega_m t \quad (5)$$

the output can be expressed as:

$$y(t) = a_0 + \sum_{n=1}^{\infty} a_n \cos\left(n\sum_{m=1}^{M} X_m \sin\omega_m t\right) + \sum_{n=1}^{\infty} b_n \sin\left(n\sum_{m=1}^{M} X_m \sin\omega_m t\right) \quad (6)$$

Using equation (6) and the trigonometric identities:

$$\sin(z\sin\phi) = 2\sum_{k=0}^{\infty} J_{2k+1}(z)\sin(2k+1)\phi, \text{ and}$$

$$\cos(z\sin\phi) = J_0(z) + 2\sum_{k=1}^{\infty} J_{2k}(z)\sin(2k)\phi,$$

where $J_1(z)$ is the Bessel function of order 1, it is easy to show that the normalized output component of frequency $\sum_{m=1}^{M} \alpha_m \omega_m$, $\sum_{m=1}^{M} |\alpha_m| =$ even/odd integer and $\alpha_m$ is a positive integer, a negative integer, or zero can be expressed as:

$$Y_{(\alpha_1,\alpha_2,\ldots,\alpha_M)} = 2\sum_{n=1}^{\infty} a_n \prod_{m=1}^{M} J_{|\alpha_m|}(nX_m) \text{ for } \sum_{m=1}^{M} |\alpha_m| = \text{even integer} \quad (7)$$

$$Y_{(\alpha_1,\alpha_2,\ldots,\alpha_M)} = 2\sum_{n=1}^{\infty} b_n \prod_{m=1}^{M} J_{|\alpha_m|}(nX_m) \text{ for } \sum_{m=1}^{M} |\alpha_m| = \text{odd integer.} \quad (8)$$

Equations (7) and (8) can be used to predict the intermodulation performance for any scenario of the input tones. For the special case of a two-tone equal-amplitude input signal, with input tone amplitudes $=X$, using equation (7), the amplitude of the second-order intermodulation component of frequency $\omega_1 - \omega_2$ can be expressed as:

$$Y_{1,1} = 2\sum_{n=1}^{\infty} a_n J_1^2(nX) \quad (9)$$

Similarly, using equation (8), the amplitude of the third-order intermodulation component of frequency $2\omega_1 - \omega_2$ can be expressed as:

$$Y_{2,1} = 2\sum_{n=1}^{\infty} b_n J_2(nX) J_1(nX) \quad (10)$$

Figure 2:
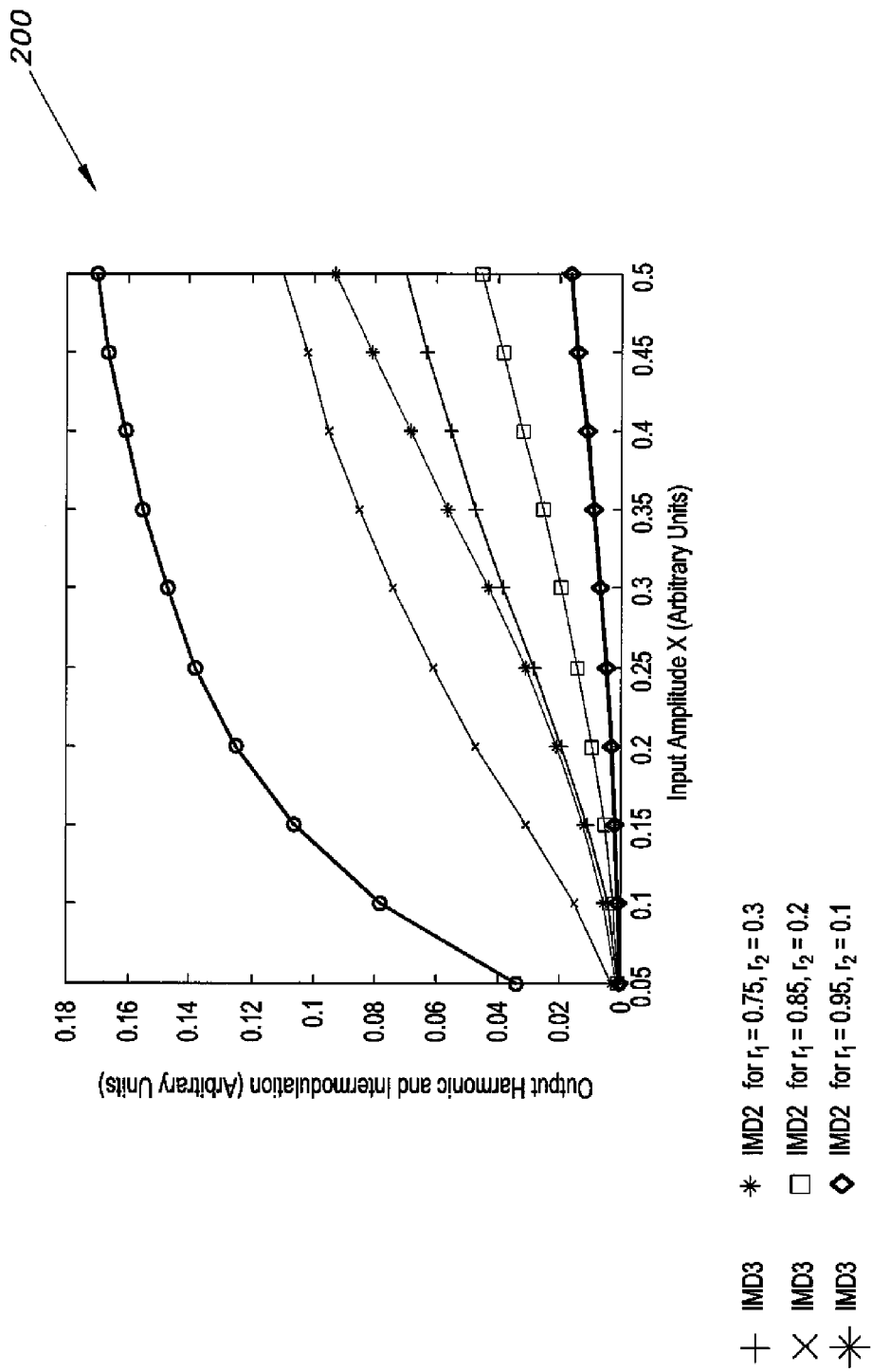
FIG. 2 is a plot of 2nd and 3rd order intermodulation performance curves for select r parameters.

Using equations (9) and (10), the second- and third-order intermodulation of the hypothetical nonlinear circuits/systems of FIG. 1 were calculated, and the results are shown in FIG. 2. Using equation (9), the resulting expression for $Y_{1,1}$ will contain one unknown only, that is, the parameter $r_1$, and two measurable quantities, X and $Y_{1,1}$. Similarly, using equation (10), the resulting expression for $Y_{2,1}$ will contain one unknown only, that is, the parameter $r_2$, and two measurable quantities, X and $Y_{2,1}$. Thus, a simple least-square curve-fitting procedure is needed to find the single unknown quantities $r_1$ and $r_2$, using the measured values of $Y_{1,1}$ and $Y_{2,1}$ over an appropriate range of levels of the input tone amplitude X. Obviously, this would be much simpler than surface fitting techniques required to fit measured data to a multiple-parameter mathematical model. Thus, the characterization of nonlinear circuits/systems with even and odd symmetries would be much more simplified.

Figure 3:
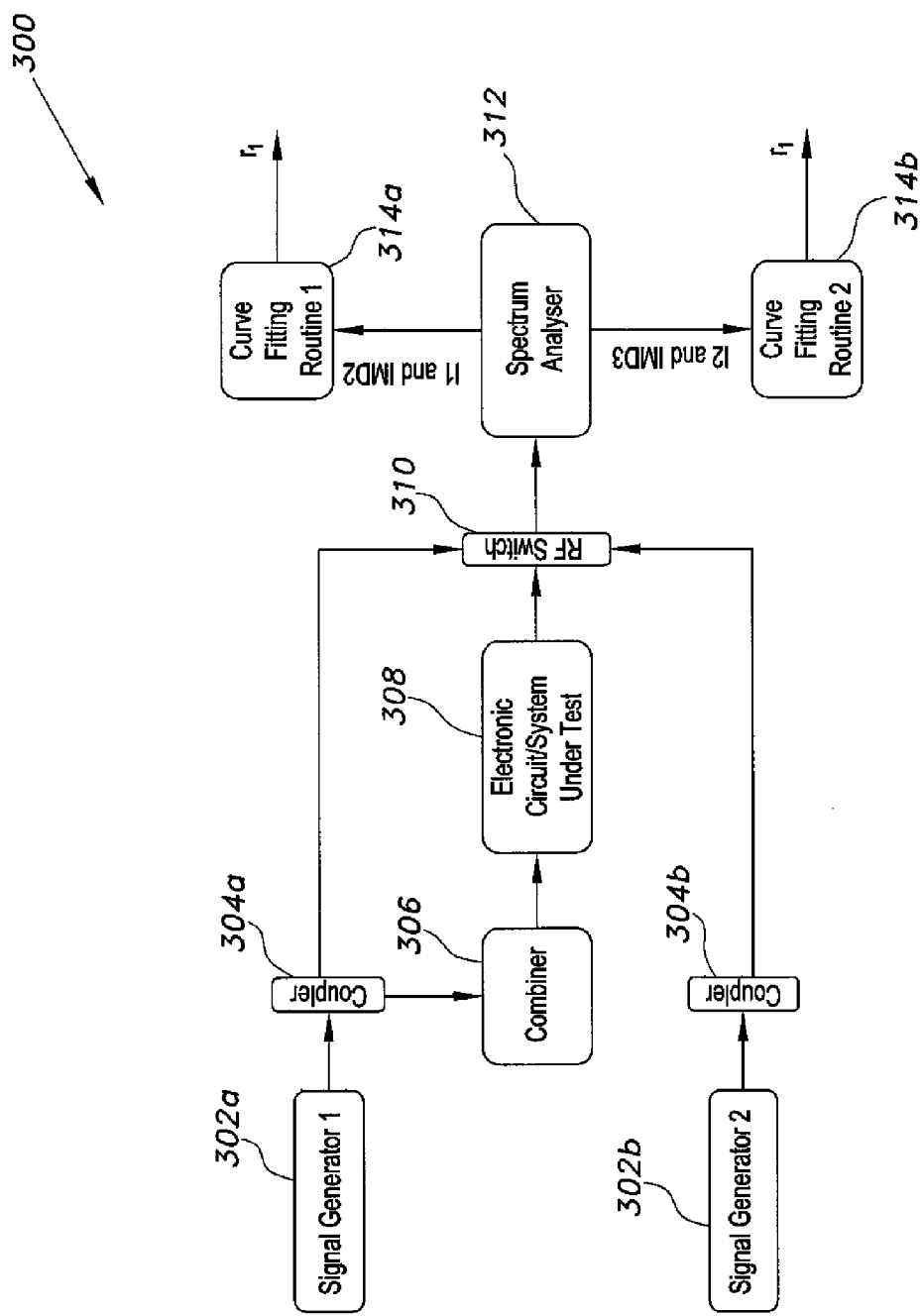
FIG. 3 is a block diagram of a nonlinear systems measurement system according to the present invention.

Based on the above mentioned method, we propose the system 300 shown in FIG. 3 for characterizing nonlinear circuits/systems with even and odd symmetries. The proposed system 300 comprises three off-the-shelf instruments, including two signal generators 302$a$ and 302$b$ to generate pure sinusoidal signals of frequencies $f_1=\omega_1/2\pi$ and $f_2=\omega_2/2\pi$, and one spectrum analyzer 312 to measure all signals. The implementation is software-driven using MATLAB. The three elements of instrument control, measurement data fetching and curve fitting are all conjoined in one program. Using couplers 304$a$ and 304$b$, the two generated sinusoidal signals are combined in a suitable combiner 306, depending on frequencies $f_1$ and $f_2$ and their amplitudes. These amplitudes are dependent on the dynamic range of the circuit/system under test 308. A bi-directional coupler (e.g., coupler 304$a$ or coupler 304$b$) is inserted in the path of a respective input signal to enable measurement of that signal by the spectrum analyzer 312. The combined signal is applied to the electronic circuit/system under test 308. A single-pole, triple-throw RF switch 310 is used to enable the amplitude measurement of the output signal from the circuit/system under test 308, as well as the two input signals to the combiner 306. This switch is also software-controlled.

At every power step, inputs to the circuit/system under test 308 are measured as amplitude I1 and amplitude I2, the amplitude of the output component from the electronic circuit/system under test 308 at $f_1-f_2$ is measured as IMD2, and the output component at $2f_1-f_2$ is measured as IMD3. The measured I1 and IMD2 are fed to the curve-fitting routine 1 (314$a$), which yields $r_1$. Similarly, the measured I2 and IMD3 are fed to curve-fitting routine 2 (314$b$), which yields $r_2$. Power losses in all signal paths are calibrated, and these amounts are used to correct for the applied and measured signals. This process is also software-controlled. The software ensures that all the instruments in the setup are synchronized, and that the fetched measurements are kept in data registers in the correct order for feeding into the two curve fitting routines.

It is to be understood that the present invention is not limited to the embodiments described above, but encompasses any and all embodiments within the scope of the following claims.

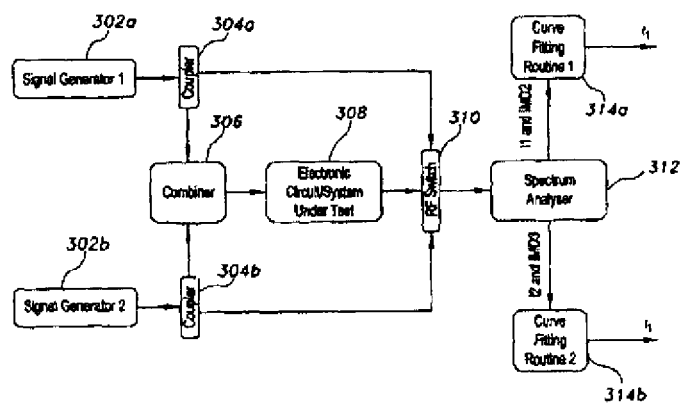

We claim:

1. A computer-implemented method for measuring nonlinear electronic systems, comprising the steps of:
   (a) applying a combination of pure sinusoidal signals at frequencies $f_1=\omega_1/2\pi$ and $f_2=\omega_2/2\pi$ to an input of an electronic unit under test (UUT), the UUT having an output;
   (b) for a discrete number of sequential input power steps, measuring and recording separately the amplitude of the $f_1=\omega_1/2\pi$ input signal as I1, the amplitude of the $f_2=\omega_2/2\pi$ input signal as I2, the amplitude of an $f_1-f_2$ second-order intermodulation component signal as IMD2 at the UUT output, and the amplitude of a $2f_1-f_2$ third-order intermodulation component signal as IMD3 at the UUT output;
   (c) curve fitting the I1 and IMD2 signals using least squares fitting;
   (d) curve fitting the I2 and IMD3 signals using least squares fitting; and
   (e) calibrating power losses in all signal paths to correct for the applied and measured signals.

2. The computer-implemented method according to claim 1, wherein steps (c) and (d) characterize the UUT when the UUT has odd symmetry.

3. The computer-implemented method according to claim 1, wherein steps (c) and (d) characterize the UUT when the UUT has even symmetry.

4. A nonlinear systems measurement system, comprising:
   means for applying a combination of pure sinusoidal signals at frequencies $f_1=\omega_1/2\pi$ and $f_2=\omega_2/2\pi$ to an input of an electronic unit under test (UUT), the UUT having an output;
   means for measuring and recording separately the amplitude of the $f_1=\omega_1/2\pi$ input signal as I1, the amplitude of the $f_2=\omega_2/2\pi$ input signal as I2, the amplitude of an $f_1-f_2$ second-order intermodulation component signal as IMD2 at the UUT output, and the amplitude of a $2f_1-f_2$ third-order intermodulation component signal as IMD3 at the UUT output for a discrete number of sequential input power steps;
   means for curve fitting the I1 and IMD2 signals using least squares fitting;
   means for curve fitting the I2 and IMD3 signals using least squares fitting; and
   means for calibrating power losses in all signal paths to correct for the applied and measured signals.

5. The nonlinear systems measurement system according to claim 4, further comprising means for characterizing the UUT when the UUT has even symmetry.

6. The nonlinear systems measurement system according to claim 4, further comprising means for characterizing the UUT when the UUT has odd symmetry.

7. A computer software product, comprising a non-transitory medium readable by a processor, the non-transitory medium having stored thereon a set of instructions for measuring nonlinear electronic systems, the set of instructions including:
   (a) a first sequence of instructions which, when executed by the processor, causes said processor to apply a combination of pure sinusoidal signals at frequencies $f_1=\omega_1/2\pi$ and $f_2=\omega_2/2\pi$ to an input of an electronic unit under test (UUT), the UUT having an output;
   (b) a second sequence of instructions which, when executed by the processor, causes said processor to, for a discrete number of sequential input power steps, measure and record separately the amplitude of the $f_1=\omega_1/2\pi$ input signal as I1, the amplitude of the $f_2=\omega_2/2\pi$ input signal as I2, the amplitude of an $f_1-f_2$ second-order intermodulation component signal as IMD2 at the UUT output, and the amplitude of a $2f_1-f_2$ third-order intermodulation component signal as IMD3 at the UUT output;
   (c) a third sequence of instructions which, when executed by the processor, causes said processor to curve fit the I1 and IMD2 signals using least squares fitting;
   (d) a fourth sequence of instructions which, when executed by the processor, causes said processor to curve fit the I2 and IMD3 signals using least squares fitting;
   (e) a fifth sequence of instructions which, when executed by the processor, causes said processor to calibrate power losses in all signal paths to correct for the applied and measured signals.

8. The computer software product according to claim 7, further comprising a sixth sequence of instructions which, when executed by the processor, causes said processor to characterize the UUT when the UUT has odd symmetry.

9. The computer software product according to claim 7, further comprising a seventh sequence of instructions which, when executed by the processor, causes said processor to characterize the UUT when the UUT has even symmetry.

* * * * *

UNITED STATES PATENT AND TRADEMARK OFFICE
CERTIFICATE OF CORRECTION

Page 1 of 2

PATENT NO.        : 8,706,434 B1
APPLICATION NO.   : 14/025734
DATED             : April 22, 2014
INVENTOR(S)       : Muhammad Taher Abuelma'Atti et al.

It is certified that error appears in the above-identified patent and that said Letters Patent is hereby corrected as shown below:

Title page should be deleted and substitute therefor the attached title page.

In the Drawings:

Delete Fig. 3 and insert the new Fig. 3 shown below.

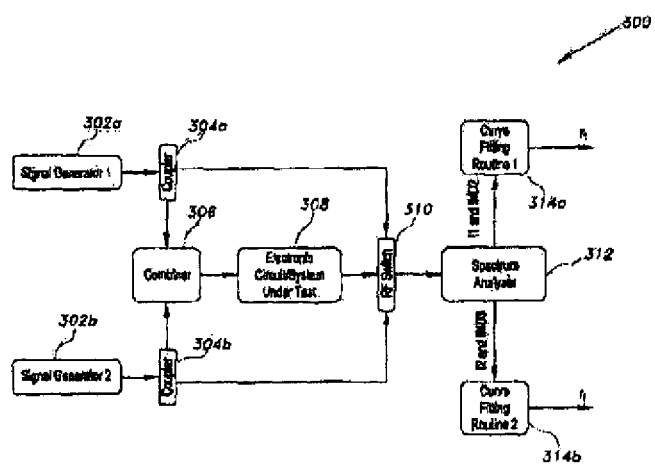

*Fig. 3*

Signed and Sealed this
Nineteenth Day of August, 2014

Michelle K. Lee
*Deputy Director of the United States Patent and Trademark Office*

(12) United States Patent
Abuelma'Atti et al.

(10) Patent No.: US 8,706,434 B1
(45) Date of Patent: Apr. 22, 2014

(54) NONLINEAR SYSTEMS MEASUREMENT SYSTEM AND METHOD

(71) Applicant: King Fahd University of Petroleum and Minerals, Dhahran (SA)

(72) Inventors: Muhammad Taher Abuelma'Atti, Dhahran (SA); Ali Muhammad Taher Abuelma'Atti, Widnes (GB)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/025,734

(22) Filed: Sep. 12, 2013

(51) Int. Cl.
G06F 15/00 (2006.01)
G01R 27/04 (2006.01)
G01R 23/20 (2006.01)

(52) U.S. Cl.
CPC .................................. G01R 23/20 (2013.01)
USPC .............................................. 702/66; 324/612

(58) Field of Classification Search
CPC ........................................................ G01R 23/20
USPC ............................................................. 702/66
See application file for complete search history.

(56) References Cited

U.S. PATENT DOCUMENTS

| 4,667,296 A * | 5/1987 | Crowe ............................ 702/110 |
| 5,909,642 A | 6/1999 | Suzuki |
| 7,671,605 B2 * | 3/2010 | Gunyan et al. ................. 324/638 |
| 7,979,837 B1 | 7/2011 | Rao et al. |
| 2010/0141269 A1 * | 6/2010 | Quan ............................... 324/622 |
| 2013/0054169 A1 | 2/2013 | Neidhardt et al. |

OTHER PUBLICATIONS

Walker et al., "Simple, Broadband Relative Phase Measurement of Intermodulation Products," Department of Electrical and Computer Engineering, North Carolina State University (Jun. 2005).

* cited by examiner

Primary Examiner — Bryan Bui
(74) Attorney, Agent, or Firm — Richard C. Litman

(57) ABSTRACT

The nonlinear systems measurement system includes two signal generators generating different sinusoidal frequencies. A spectrum analyzer measures all signals. A single software program synchronizes the instruments. The fetched measurements are kept in data registers in correct sequence for feeding into two curve fitting routines. The sinusoidal signals are fed to a suitable combiner for the expected frequencies and dynamic range of the UUT. The combined signal is applied to the UUT. Via a software-controlled single-pole, triple-throw RF switch, the amplitude of the UUT output and the two input signals are measured at every power step as amplitude I1 and amplitude I2. The amplitude of the output component from the UUT at $f_1-f_2$ is measured as IMD2 and the output component at $2f_1-f_2$ is measured as IMD3. The measured I1 and IMD2 are fed to the curve-fitting routine 1, yielding $r_1$. The measured I2 and IMD3 are fed to curve-fitting routine 2, yielding $r_2$.

9 Claims, 3 Drawing Sheets